United States Patent
Sandhu et al.

(10) Patent No.: US 8,785,288 B2
(45) Date of Patent: Jul. 22, 2014

(54) METHODS OF MAKING MEMORY CELLS

(71) Applicant: Micron Technology, Inc., Boise, ID (US)

(72) Inventors: Gurtej S. Sandhu, Boise, ID (US); Sumeet C. Pandey, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/024,836

(22) Filed: Sep. 12, 2013

(65) Prior Publication Data

US 2014/0011322 A1 Jan. 9, 2014

Related U.S. Application Data

(62) Division of application No. 13/464,934, filed on May 4, 2012, now Pat. No. 8,558,209.

(51) Int. Cl.
*H01L 21/3205* (2006.01)
*H01L 43/08* (2006.01)
*G11C 11/56* (2006.01)

(52) U.S. Cl.
USPC ............... 438/385; 438/330; 257/E21.004; 257/E43.004; 365/148

(58) Field of Classification Search
None
See application file for complete search history.

(56) References Cited

U.S. PATENT DOCUMENTS

| | | | |
|---|---|---|---|
| 7,420,199 B2 | 9/2008 | Gutsche et al. | |
| 7,563,639 B2 | 7/2009 | Shin et al. | |
| 7,649,191 B2 | 1/2010 | Czubatyj et al. | |
| 7,867,814 B2 | 1/2011 | Nihei et al. | |
| 8,054,674 B2 | 11/2011 | Tamai et al. | |
| 8,106,517 B2 | 1/2012 | Kabir et al. | |
| 8,116,116 B2 | 2/2012 | Hwang et al. | |
| 8,124,441 B2 | 2/2012 | Jin et al. | |
| 8,183,553 B2 | 5/2012 | Phatak et al. | |
| 8,203,154 B2 | 6/2012 | Wang et al. | |
| 8,203,865 B2 | 6/2012 | Tian et al. | |
| 8,253,253 B2 | 8/2012 | Brud et al. | |
| 8,264,866 B2 | 9/2012 | Fukumizu et al. | |
| 8,324,065 B2 | 12/2012 | Sandhu et al. | |
| 8,331,131 B2 | 12/2012 | Miao et al. | |
| 2007/0111486 A1 | 5/2007 | Tour et al. | |
| 2007/0257246 A1 | 11/2007 | Bakkers et al. | |
| 2007/0267624 A1 | 11/2007 | Ovshinsky | |
| 2010/0108975 A1 | 5/2010 | Sun et al. | |
| 2010/0163823 A1* | 7/2010 | Sim et al. ............... 257/2 |

(Continued)

FOREIGN PATENT DOCUMENTS

JP 2011096714 A 5/2011

*Primary Examiner* — Zandra Smith
*Assistant Examiner* — Pamela E Perkins
(74) *Attorney, Agent, or Firm* — Wells St. John P.S.

(57) ABSTRACT

Some embodiments include a memory cell having a data storage region between a pair of conductive structures. The data storage region is configured to support a transitory structure which alters resistance through the memory cell. The data storage region includes two or more portions, with one of the portions supporting a higher resistance segment of the transitory structure than another of the portions. Some embodiments include a method of forming a memory cell. First oxide and second oxide regions are formed between a pair of conductive structures. The oxide regions are configured to support a transitory structure which alters resistance through the memory cell. The oxide regions are different from one another so that one of the oxide regions supports a higher resistance segment of the transitory structure than the other.

6 Claims, 5 Drawing Sheets

(56) References Cited

U.S. PATENT DOCUMENTS

| | | |
|---|---|---|
| 2010/0176367 A1* | 7/2010 | Liu ................................ 257/4 |
| 2010/0193761 A1 | 8/2010 | Amin et al. |
| 2010/0302705 A1* | 12/2010 | Antonov et al. ............. 361/313 |
| 2010/0314602 A1 | 12/2010 | Takano et al. |
| 2011/0037043 A1 | 2/2011 | Wada |
| 2011/0044089 A1* | 2/2011 | Goux et al. .................. 365/148 |
| 2011/0068313 A1 | 3/2011 | Liu |
| 2011/0175052 A1 | 7/2011 | Hwang et al. |
| 2011/0193043 A1 | 8/2011 | Chin |
| 2012/0008369 A1 | 1/2012 | Shimuta et al. |
| 2012/0104343 A1 | 5/2012 | Ramaswamy et al. |
| 2012/0156854 A1 | 6/2012 | Chen et al. |
| 2012/0205610 A1 | 8/2012 | Phatek et al. |
| 2012/0218806 A1* | 8/2012 | Liu et al. ...................... 365/148 |
| 2012/0235112 A1 | 9/2012 | Huo et al. |
| 2013/0001504 A1 | 1/2013 | Ninomiya et al. |
| 2013/0037772 A1 | 2/2013 | Sills |
| 2013/0069201 A1 | 3/2013 | Hashim et al. |
| 2013/0075686 A1 | 3/2013 | Kawasaki |
| 2013/0099342 A1 | 4/2013 | Fonash et al. |

\* cited by examiner

METHODS OF MAKING MEMORY CELLS

RELATED PATENT DATA

This patent resulted from a divisional of U.S. patent application Ser. No. 13/464,934, which was filed May 4, 2012, which issued as U.S. Pat. No. 8,558,209, and which is hereby incorporated herein by reference.

TECHNICAL FIELD

Memory cells and methods of making memory cells.

BACKGROUND

Memory is one type of integrated circuitry, and is used in systems for storing data. Memory is usually fabricated in one or more arrays of individual memory cells. The memory cells are configured to retain or store information in at least two different selectable states. In a binary system, the states are considered as either a "0" or a "1". In other systems, at least some individual memory cells may be configured to store more than two levels or states of information.

Integrated circuit fabrication continues to strive to produce smaller and denser integrated circuits. Accordingly, there has been substantial interest in memory cells that can be utilized in structures having programmable material between a pair of electrodes; where the programmable material has two or more selectable resistive states to enable storing of information. Examples of such memory cells are resistive RAM (RRAM) cells, phase change RAM (PCRAM) cells, and programmable metallization cells (PMCs)—which may be alternatively referred to as a conductive bridging RAM (CBRAM) cells, nanobridge memory cells, or electrolyte memory cells. The memory cell types are not mutually exclusive. For example, RRAM may be considered to encompass PCRAM and PMCs.

An example prior art memory cell 5 is shown in FIG. 1 as transitioning between two memory states. One of the memory states is a high resistance state (HRS) and the other is a low resistance state (LRS). The memory cell comprises a data storage region 7 between a pair of conductive structures 1 and 3. The data storage region may comprise any of the programmable materials described above.

The memory cell is reversibly transitioned between HRS and LRS through formation of a transitory structure 9 within the memory cell. The transitory structure may be a filament, conductive bridge, or any other suitable structure which reduces resistance through the memory cell. A portion of the conductive filament is shown to be present in the HRS, but in other applications there may be little or no portion of the conductive filament present in the HRS. Although the transitory structure is shown as a single straight line, persons of ordinary skill in the art will recognize that the transitory structure may have numerous configurations depending on the nature of the memory cell, and the chemistry and physics involved in formation of the transitory structure. For instance, the transitory structure may form through dendritic growth, and thus may comprise one or more multi-branching paths. As another example, the transitory structure may comprise a region of changed phase, altered vacancy concentration, altered ion concentration (for instance, altered oxygen ion concentration), etc; which may or may not be part of a filament. If the transitory structure comprises a filament, such filament may be continuous in some memory cells, and may have discontinuities in other memory cells.

The building blocks of the transitory structure may be atoms, ions, clusters, vacancies, etc., depending on the chemistry of the data storage region of the memory cell. The transitory structure may directly physically contact the conductive structures on opposing sides of the transitory structure. Alternatively, the transitory structure may be spaced from at least one of the conductive structures by a small gap, with such gap being narrow enough that charge "tunnels" the gap during current flow through the memory cell.

The memory cell 5 may be programmed by providing appropriate voltage across the memory cell to either create the transitory structure 9, or to remove such transitory structure. The memory cell may be read by providing suitable voltage across memory cell to determine a resistance through the memory cell, while limiting the voltage to a level which does not cause programming of the memory cell.

Programmable memory cells of the type described in FIG. 1 may be scalable, and thus suitable for utilization in future generations of memory. However, problems are encountered in attempting to utilize such memory cells. For instance, some conventional memory cells are "leaky" in the memory states. FIG. 2 schematically depicts the LRS state of memory cell 5 as comprising a resistor 10 between the conductive structures 1 and 3. Such resistor represents the resistance through the memory cell when the transitory structure 9 (FIG. 1) is present. The resistance can be quite low, and the memory cell may be quite leaky. Accordingly, the memory cell 5 may be paired with a select device 12, as shown in FIG. 3, in order to better control current flow to and from the memory cell. The select device may be any of numerous devices, including, for example, a diode, a switch, a transistor, etc.

It is desired to develop improved memory cells, and improved methods of forming such memory cells.

DETAILED DESCRIPTION OF THE ILLUSTRATED EMBODIMENTS

Some embodiments described herein include recognition that the leakage problem of some conventional memory cells may be alleviated, or even prevented, by increasing the resistance of the memory cells.

Figure 2:
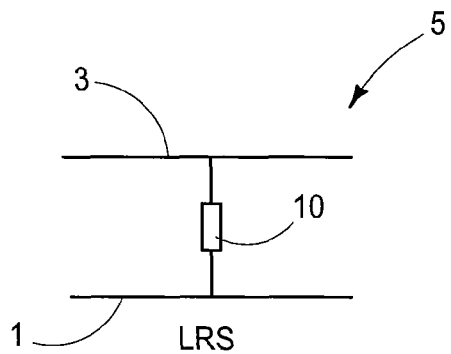
FIGS. 2 and 3 schematically illustrate prior art memory cell configurations.
Figure 3:
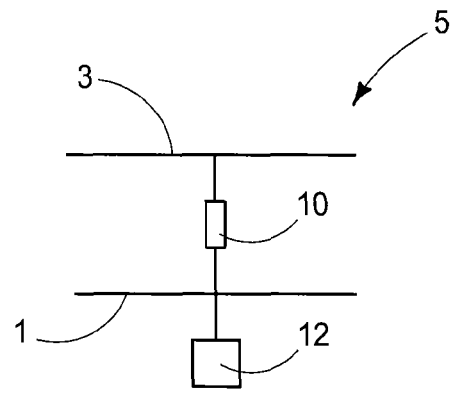
Figure 4:
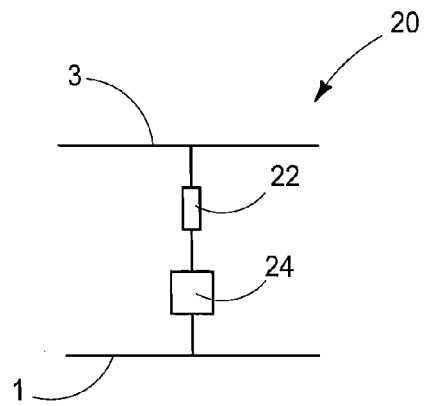
FIG. 4 schematically illustrates an example embodiment memory cell configuration.

FIG. 4 schematically illustrates an example embodiment memory cell 20. The memory cell comprises two resistors 22 and 24 in series between the conductive structures 1 and 3. The resistor 22 may comprise low resistance, and may be analogous to the resistor 10 described above relative to the prior art memory cell 5 of FIG. 2. The resistor 24 represents a modification to memory cell which increases resistance through the memory cell relative to the prior art memory cell. Such modification may include any of numerous changes within one or more materials of the memory cell, including, for example, changes in crystallinity, density, dopant concentration, etc.; as discussed below with reference to FIGS. 5-15.

Figure 1:
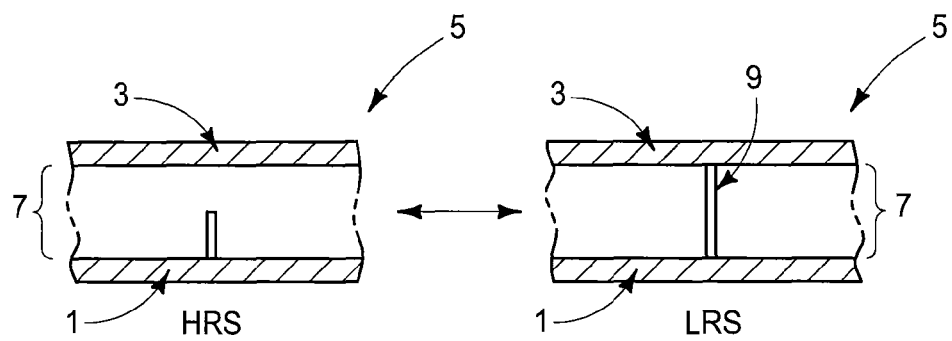
FIG. 1 diagrammatically illustrates two interchangeable memory states of a prior art memory cell.

The prior art memory cell 5 of FIG. 1 was shown to comprise a data storage region 7. Such prior art memory cell operated through use of a transitory structure 9 which extended through the data storage region in the LRS mode of the cell, and which may be fully or at least partially absent in the HRS mode of the cell. In some embodiments, a memory cell may be formed to have a data storage region with at least two physically different portions so that one of the portions supports a higher resistance segment of a transitory structure than another of the portions. In such embodiments, the resistor 24 of FIG. 4 may correspond to the resistance through the higher resistance segment of the transitory structure, and the resistor 22 may correspond to the resistance through the lower resistance segment of the transitory structure. The terms "higher resistance" and "lower resistance" are utilized to indicate resistance relative to one another, rather than relative to any external standard.

Figure 5:
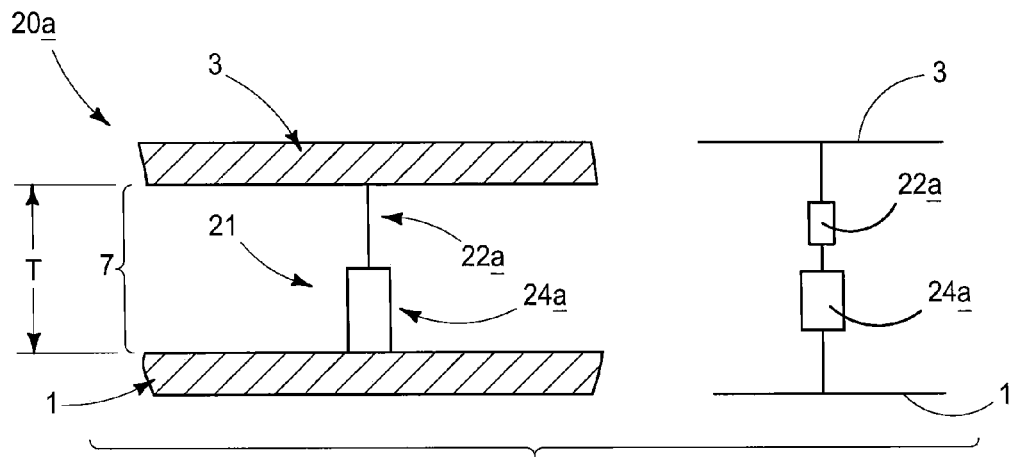
FIGS. 5-7 diagrammatically illustrate example memory cell configurations alongside schematic diagrams of the configurations.
Figure 6:
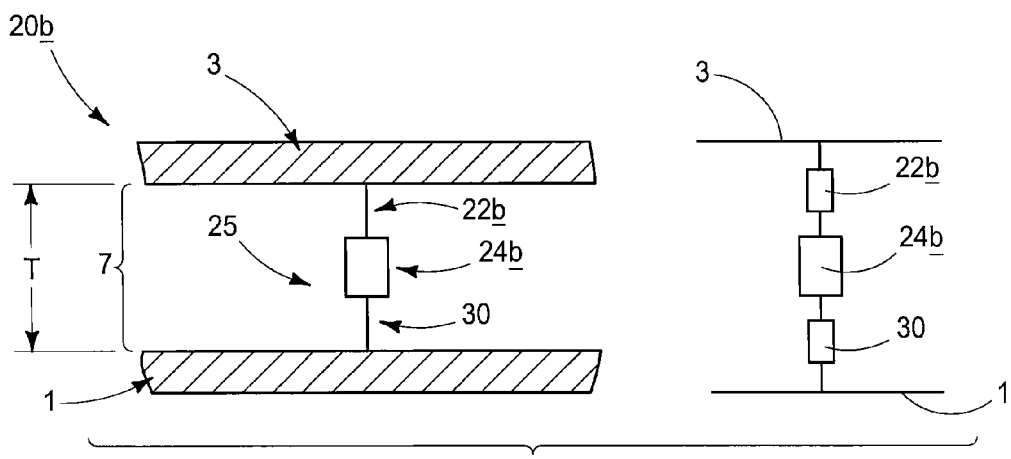
Figure 7:
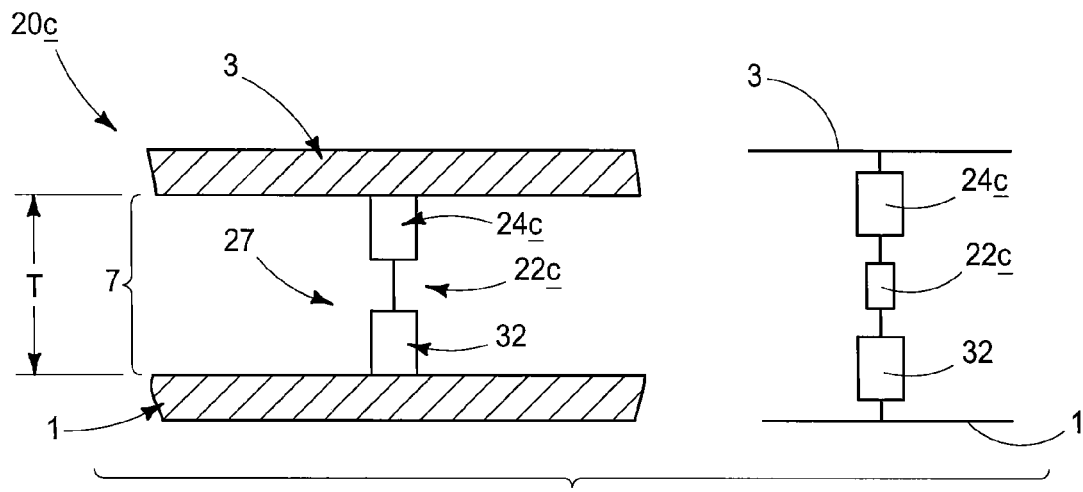

FIGS. 5-7 diagrammatically illustrate some example embodiment memory cells.

Referring to FIG. 5, a memory cell 20a is shown to comprise a transitory structure 21 extending across the data storage region 7, and between the conductive structures 1 and 3. The transitory structure has a lower resistance segment 22a and a higher resistance segment 24a. The higher resistance segment is illustrated to be wider than the lower resistance segment, and such may be an accurate representation of some embodiments. However, the structure of FIG. 5 may also be considered to be a generalized diagram that can encompass any transitory structure having the illustrated relationship in which one segment of the transitory structure has a higher resistance than another.

In embodiments in which the lower resistance segment of the transitory structure is actually a physically narrow part of a filament extending across data storage region 7, such lower resistance segment may correspond to a tip of the transitory structure which is the part of the transitory structure nearest to the conductive structure 3. Such tip may directly contact a surface of conductive structure 3 in some embodiments, or may be spaced from the surface of the conductive structure by a small gap that charge "tunnels" during current flow across the data storage region. In some embodiments, the lower resistance segment 22a may have a resistance approaching a possible theoretical minimum resistance of about 12.906 kilo-ohms.

The data storage region 7 has a thickness "T" between a surface of the conductive structure 1 and a surface of the conductive structure 3. In some embodiments, the data storage region may comprise one or more metal oxides extending entirely across "T". In some embodiments, the lower resistance segment of the transitory structure 21 may extend a distance of less than or equal to about one-fourth of "T". For instance, in some embodiments "T" may be from about 5 nanometers to about 20 nanometers, and the lower resistance segment may extend a distance of less than or equal to about 4 nanometers.

A schematic diagram is provided on the right side of FIG. 5. Such diagram represents the higher resistance segment of transitory structure 21 as a resistor 24a, and represents the lower resistance segment as a resistor 22a connected in series with the resistor 24a.

FIG. 6 shows an example embodiment memory cell 20b having a transitory structure 25 extending across the data storage region 7, and between the conductive structures 1 and 3. The transitory structure has a higher resistance segment 24b between a pair of lower resistance segments 22b and 30. The higher resistance segment is illustrated to be wider than the lower resistance segments, and such may be an accurate representation of some embodiments. However, the structure of FIG. 6 may also be considered to be a generalized diagram that can encompass any transitory structure having the illustrated relationship in which one segment of the transitory structure has a higher resistance than a pair of other segments. The lower resistance segments 22b and 30 may have approximately the same resistance as one another in some embodiments, and may have different resistances than one another in other embodiments. In some embodiments, both of the lower resistance segments 22b and 30 may have resistances approaching about 12.906 kilo-ohms, and may correspond to tips of the transitory structure 25 nearest the conductive structures 3 and 1, respectively.

In some embodiments, the transitory structure 25 of FIG. 6 may be considered to have a first lower resistance segment 22b directly against a surface of conductive structure 3, and to have a second lower resistance segment 30 directly against a surface of conductive structure 1. The transitory structure may also be considered to have a higher resistance segment 24b which is not directly against surfaces of either of the conductive structures 1 and 3, but which is instead spaced from such conductive structures by the lower resistance segments 22b and 30. In some embodiments, the segments 22b and 30 may be spaced from surfaces of conductive structures 3 and 1 by small gaps, even though such segments are the parts of the transitory structure closest to such conductive structures, provided that charge can "tunnel" such gaps during current flow along the transitory structure.

A schematic diagram is provided on the right side of FIG. 6. Such diagram represents the higher resistance segment of transitory structure 25 as a resistor 24b, and represents the lower resistance segments as resistors 22b and 30. The resistors 22b, 24b and 30 are connected in series.

FIG. 7 shows an example embodiment memory cell 20c having a transitory structure 27 extending across the data storage region 7, and between the conductive structures 1 and 3. The transitory structure has a lower resistance segment 22c between a pair of higher resistance segments 24c and 32. The higher resistance segments are illustrated to be wider than the lower resistance segment, and such may be an accurate representation of some embodiments. However, the structure of FIG. 6 may also be considered to be a generalized diagram that can encompass any transitory structure having the illustrated relationship in which one segment of the transitory structure has a lower resistance than a pair of other segments. The higher resistance segments 24c and 32 may have approximately the same resistance as one another in some embodiments, and may have different resistances than one another in other embodiments.

In some embodiments, the transitory structure 27 of FIG. 7 may be considered to have a first higher resistance segment 24c directly against a surface of conductive structure 3, and to have a second higher resistance segment 32 directly against a surface of conductive structure 1. The transitory structure may also be considered to have a lower resistance segment 22c which is not directly against surfaces of either of the conductive structures 1 and 3, but which is instead spaced from such conductive structures by the higher resistance segments 24c and 32. In some embodiments, the segments 24c and 32 may be spaced from surfaces of conductive structures 3 and 1 by small gaps, even though such segments are the parts of the transitory structure closest to such conductive structures, provided that charge can "tunnel" such gaps during current flow along the transitory structure.

A schematic diagram is provided on the right side of FIG. 7. Such diagram represents the higher resistance segments of transitory structure 27 as resistors 24c and 32, and represents the lower resistance segment as a resistor 22c. The resistors 22c, 24c and 32 are connected in series.

The constructions shown in FIGS. 5-7 are example constructions in which a transitory structure comprises at least one lower resistance segment and at least one higher resistance segment. Other embodiments may comprise other arrangements of lower resistance segments and a higher resistance segments than shown in FIGS. 5-7, and in some embodiments may comprise more than two lower resistance segments and/or more than two higher resistance segments.

Figure 8:
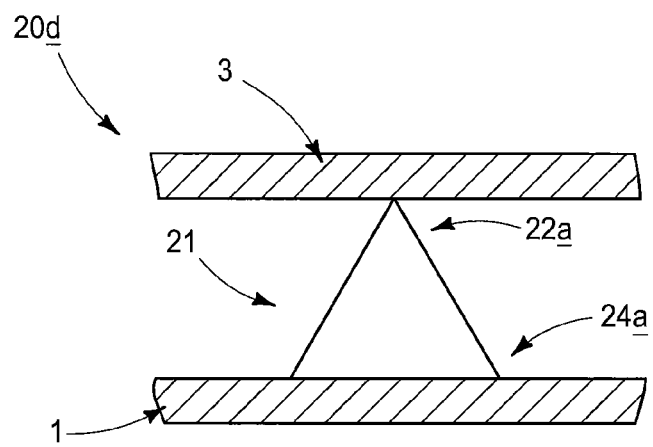
FIGS. 8-10 diagrammatically illustrate additional example memory cell configurations.
Figure 9:
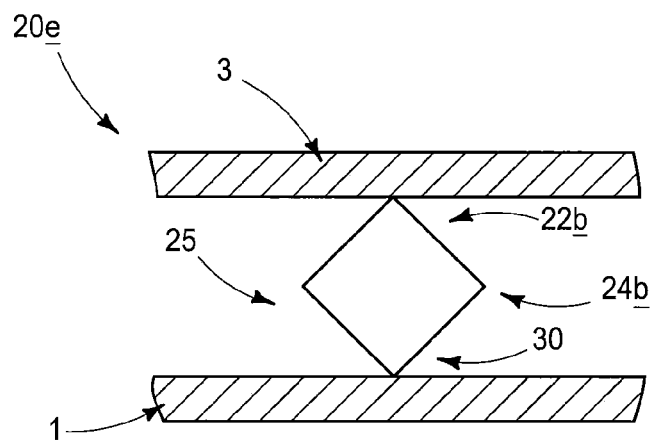
Figure 10:
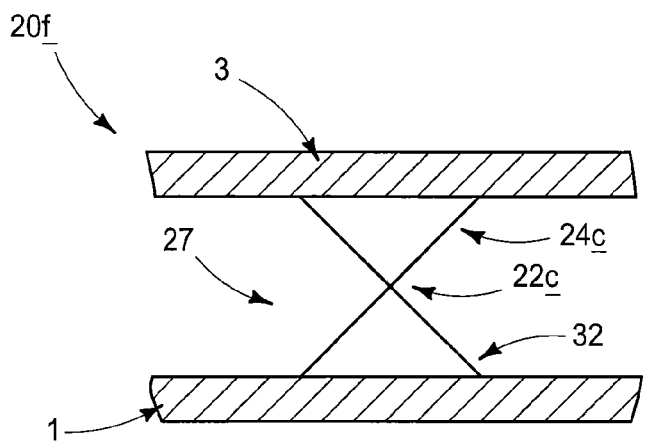

The shown embodiments of FIGS. 5-7 have abrupt transitions where the higher resistance segments join to the lower resistance segments. In other embodiments, the transitions between the lower resistance segments and the higher resistance segments may be more gradual. For instance, FIGS. 8-10 show example embodiment memory cells 20d-f analogous to the memory cells 20a-c, respectively, of FIGS. 5-7; but diagrammatically illustrate gradual transitions between the lower resistance segments and the higher resistance segments of the transitory structures 21, 25 and 27, rather than the abrupt transitions of FIGS. 5-7.

Figure 11:
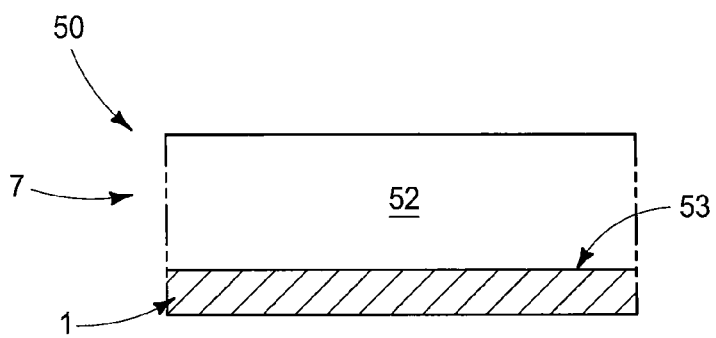
FIGS. 11-13 are diagrammatic cross-sectional views of a memory cell at various process stages of an example embodiment method of forming a memory cell.
Figure 12:
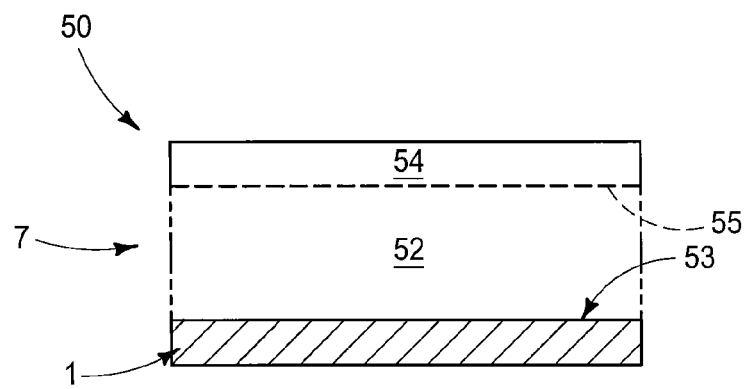
Figure 13:
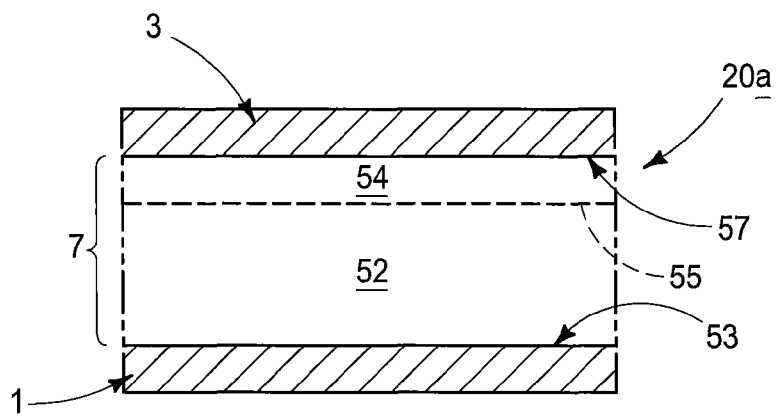

The memory cells of FIGS. 5-10 may be formed utilizing any suitable processing. FIGS. 11-13 describe an example method which may be utilized to form the memory cell 20a of FIG. 5.

FIG. 11 shows a construction 50 comprising a material 52 over the conductive structure 1. The material 52 is a first portion of a data storage region 7. The material 52 may comprise any material suitable for utilization in the data storage region. For instance, the material 52 may comprise a composition suitable for utilization in one or more of PCRAM, RRAM, CBRAM, PMC, etc. In some embodiments, the material 52 may comprise a metal oxide; and may, for example, comprise an oxide containing one or more of aluminum, antimony, barium, calcium, cesium, hafnium, iron, lanthanum, lead, magnesium, manganese, nickel, praseodymium, ruthenium, samarium, strontium, tantalum, tellurium, titanium, vanadium, yttrium and zirconium. In some embodiments, the material 52 may comprise multivalent metal oxide; and may, for example, comprise, consist essentially of, or consist of one or more of barium, ruthenium, strontium, titanium, calcium, manganese, praseodymium, lanthanum and samarium. In some embodiments, the material 52 may comprise chalcogenide-type material (for instance, a material comprising germanium in combination with one or more of antimony, tellurium, sulfur and selenium).

In the shown embodiment, the material 52 is deposited directly onto a surface 53 of conductive structure 1.

The conductive structure 1 may comprise any suitable electrically conductive material or combination of materials; and in some embodiments may comprise one or more of various metals (for instance, tungsten, titanium, copper, aluminum, etc.), metal-containing compositions (for instance, metal silicides, metal carbide, etc.), and conductively-doped semiconductor materials (for instance, conductively-doped silicon, conductively-doped germanium, etc.).

The material 52 may be deposited utilizing any suitable methodology, including, for example, one or more of physical vapor deposition (PVD), chemical vapor deposition (CVD) and atomic layer deposition (ALD).

The conductive structure 1 may be supported over a semiconductor substrate, such as a monocrystalline silicon wafer comprising one or more levels associated with integrated circuit fabrication. The terms "semiconductive substrate," "semiconductor construction" and "semiconductor substrate" mean any construction comprising semiconductor material, including, but not limited to, bulk semiconductor materials such as a semiconductor wafer (either alone or in assemblies comprising other materials), and semiconductor material layers (either alone or in assemblies comprising other materials). The term "substrate" refers to any supporting structure, including, but not limited to, the semiconductor substrates described above.

Referring to FIG. 12, a material 54 is formed over material 52. A dashed line 55 is provided to diagrammatically illustrate an interface between materials 52 and 54. The material 54 corresponds to a second portion of the data storage region 7. Material 54 is physically different from material 52. In some embodiments, materials 52 and 54 may have an identical composition as one another, but may differ from one another in terms of one or more of density, order and crystallinity. In such embodiments, material 52 may be formed utilizing first deposition conditions, and material 54 may be formed utilizing second deposition conditions which differ from the first deposition conditions. For instance, material 52 may correspond to a first oxide deposited utilizing a first temperature and a first pressure, and material 54 may correspond to a second oxide deposited utilizing a second temperature and a second pressure; with the second temperature being different from the first temperature and/or with the second pressure being different from the first pressure. In some embodiments, the first and second metal oxides 52 and 54 may be identical in composition to one another, and may differ from one another only in one or more of density, order and crystallinity. In other embodiments, the first and second metal oxides 52 and 54 may be of different compositions relative to one another.

In an example embodiment, materials 52 and 54 may comprise, consist essentially of, or consist of an oxide comprising one or both of hafnium and zirconium. The material 54 may be formed utilizing a combination of temperature and pressure so that such material has a relatively low amount of disorder as compared to the material 52 which is formed utilizing a combination of temperature and pressure such that the material 52 has a relatively high amount of disorder. For instance, material 54 may be formed utilizing approximately atmospheric pressure, and a temperature of less than or equal to about 25° C.; and material 52 may be formed utilizing a temperature that is at least about 500° C. greater than the temperature utilized to form material 54, and/or a pressure which is at least about a factor of 50 greater than the pressure utilized to form material 52. The relatively disordered material 52 will support a portion of a transitory structure having higher resistance than the portion supported by the relatively ordered material 54. Thus, the materials 52 and 54 together support a transitory structure of the type shown in FIG. 5 as structure 21, with the segment 22a of such transitory structure being supported by material 54, and the segment 24a being supported by material 52.

The material 52 may be disordered relative to material 54 through any of a number of physical differences between the materials 52 and 54. For instance, material 52 may be more amorphous than material 54 (i.e., material 54 may have higher crystallinity than material 52); material 52 may have higher disorder of vacancy arrangements then material 54; may have less/more defects in a lattice; and/or may have greater disorder in distribution of the lattice defects.

The physical differences between materials 52 and 54 may be generated with other methods either in addition to, or alternatively to, the utilization of different deposition conditions for forming materials 52 and 54. For instance, in some embodiments dopant may be incorporated into one of the materials 52 and 54 to create a physical difference between materials 52 and 54. In some embodiments, the dopant may be incorporated into the material 52 that ultimately supports the higher resistance segment of a transitory structure. The dopant may be utilized to create disorder in material 52 through generation of disordered vacancy arrangements, creation of a disordered lattice, and/or reducing crystallinity within material 52.

In some embodiments, dopant is incorporated into material 52 by in situ incorporation of the dopant during deposition of material 52. In some embodiments, material 52 comprises metal oxide and the dopant comprises one or more elements, other than oxygen, selected from group 16 of the periodic table (for instance, comprises one or more of sulfur, selenium and tellurium). Such dopant may be present in material 52 to a concentration within a range of from about 0.5 atomic percent to about 50 atomic percent, and may be substantially or entirely absent from material 54 in order to create the desired physical difference between materials 52 and 54.

Referring to FIG. 13, conductive structure 3 is formed over material 54 to complete fabrication of memory cell 20*a*. In the shown embodiment, the conductive structure 3 has a surface 57 which is directly against material 54. The conductive structure 3 may comprise any of the materials discussed above regarding conductive structure 1. The conductive structures 1 and 3 may have the same composition as one another in some embodiments, and may have different compositions from one another in other embodiments.

The materials 52 and 54 have a physical difference which promotes formation of a desired transitory structure as the memory cell 20*a* is transitioned from a HRS mode to a LRS mode. The physical difference between materials 52 and 54 is present in both the HRS and LRS modes. Some prior art memory cells have physically different materials present in either the LRS mode or the HRS mode (for instance, phase change memory cells may have a crystalline region present in combination with an amorphous region), but the physical difference is not retained in both the LRS and HRS modes. Instead, the physical difference corresponds to a transitory structure formed in transitioning between the HRS and LRS modes. In contrast to such prior art memory cells, the memory cell of FIG. 13 has a physical difference between portions of the data storage region 7 which is retained in both the HRS and LRS modes of the cell.

One of the materials 52 and 54 of FIG. 13 may be referred to as a disordered material and the other as an ordered material, in some embodiments. In the embodiment of FIG. 13, the disordered material directly contacts a surface of one of the conductive structures 1 and 3, and the ordered material directly against a surface of the other of the conductive structures 1 and 3; and thus the embodiment of FIG. 13 is configured to support a transitory structure of the type shown in FIG. 5. In other embodiments, the disordered material may be between a pair of ordered materials so that the memory cell is configured to support a transitory structure of the type shown in FIG. 6; and in yet other embodiments the ordered material may be between a pair of disordered materials so that the memory cell is configured to support a transitory structure of the type shown in FIG. 7.

Figure 14:
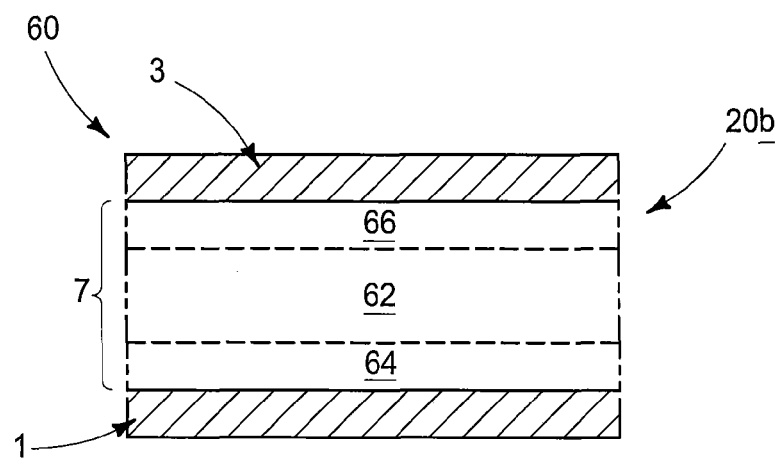
FIGS. 14 and 15 are diagrammatic cross-sectional views of example embodiment memory cells.

An example embodiment in which a disordered material is between a pair of ordered materials is shown in FIG. 14. Specifically, FIG. 14 shows a construction 60 comprising a data storage region 7 having a disordered region 62 between a pair of ordered regions 64 and 66. The regions 64 and 66 may be deposited utilizing conditions analogous to those described above with reference to FIG. 12 for deposition of material 54, and the disordered region 62 may be deposited utilizing conditions analogous to those discussed above with reference to FIG. 11 for deposition of material 52.

In some embodiments, the regions 62, 64 and 66 may consist of the same composition as one another, but differ from one another in physical properties so that regions 64 and 66 have more order than region 62. For instance, in some embodiments the entire thickness of data storage region 7 may comprise a metal oxide composition, with region 62 having lower density and/or lower crystallinity relative to regions 64 and 66. The regions 64 and 66 may comprise about the same amount of order as one another, or may differ from one another in the relative amount of order. In some embodiments, region 62 may have a higher concentration of dopant than regions 64 and 66. For instance, region 62 may be deposited while incorporating dopant into such region through in situ dopant incorporation methodologies. The region 62 may have a dopant concentration within a range of from about 0.5 atomic percent to about 50 atomic percent; and the dopant may be substantially or entirely absent from regions 64 and 66 in order to create the desired differences in disorder of region 62 relative to regions 64 and 66. In some embodiments, the regions 64 and 66 may have similar dopant concentration to another (which can include embodiments in which regions 64 and 66 have essentially no dopant concentration), and in other embodiments regions 64 and 66 may have a different dopant concentration relative to one another.

The construction 60 of FIG. 14 may be utilized to support a transitory structure of the type described with reference to FIG. 6; with lower resistance segments 30 and 22*b* of the transitory structure being supported by the ordered regions 64 and 66, and with the higher resistance segment 24*b* of the transitory structure being supported by the disordered region 62.

In some embodiments, the data storage region 7 may have a thickness between conductive structures 1 and 3 within a range of from about 5 nanometers to about 20 nanometers; and regions 64 and 66 may each have thicknesses of less than or equal to about 4 nanometers.

Figure 15:
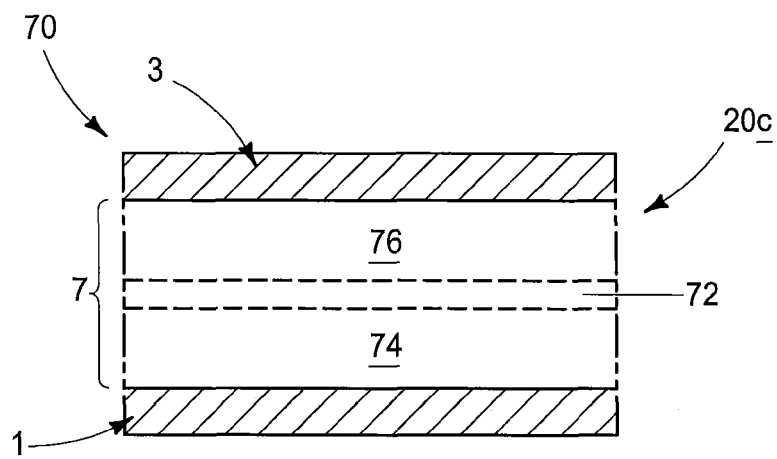

An example embodiment in which an ordered material is between a pair of disordered materials is shown in FIG. 15. Specifically, FIG. 15 shows a construction 70 comprising a data storage region 7 having an ordered region 72 between a pair of disordered regions 74 and 76. The disordered regions 74 and 76 may be deposited utilizing conditions analogous to those described above with reference to FIG. 11 for deposition of material 52, and the ordered region 72 may be deposited utilizing conditions analogous to those discussed above with reference to FIG. 12 for deposition of material 54.

In some embodiments, the regions 72, 74 and 76 may consist of the same composition as one another, but differ from one another in physical properties so that regions 74 and 76 have less order than region 72. For instance, in some embodiments the entire thickness of data storage region 7 may comprise a metal oxide composition, with region 72 having higher density, higher crystallinity and/or different order relative to regions 74 and 76. The regions 74 and 76 may comprise the same amount of disorder as one another, or may differ from one another in the relative amount of disorder. In some embodiments, regions 74 and 76 may have a higher concentration of dopant than region 72. For instance, regions 74 and 76 may be deposited while incorporating dopant into such regions through in situ dopant incorporation methodologies. The regions 74 and 76 may have dopant concentrations within a range of from about 0.5 atomic percent to about 50 atomic percent; and the dopant may be substantially or entirely absent from region 72 in order to create the desired differences in disorder of region 72 relative to regions 74 and 76. In some embodiments, the regions 74 and 76 may have similar dopant concentration to another, and in other embodiments regions 74 and 76 may have a different dopant concentration relative to one another.

The construction 70 of FIG. 15 may be utilized to support a transitory structure of the type described with reference to FIG. 7; with higher resistance segments 24c and 32 of the transitory structure being supported by the disordered regions 74 and 76, and with the lower resistance segment 22c of the transitory structure being supported by the ordered region 72.

In some embodiments, the data storage region 7 may have a thickness between conductive structures 1 and 3 within a range of from about 5 nanometers to about 20 nanometers; and region 72 may have a thickness of less than or equal to about 4 nanometers.

Although the constructions of FIGS. 13-15 are described as supporting cells of the types described in FIGS. 5-7, respectively; in other embodiments the constructions may support cells of the types described in FIGS. 8-10. For instance, if the transitions between adjacent materials of the data storage regions are graduated rather than abrupt, the constructions may be more likely to support cells of the types described in FIGS. 8-10 rather than cells of the types described in FIGS. 5-7.

In some embodiments, the incorporation of higher resistance segments of transitory structures into memory cells, as discussed above with reference to FIGS. 5-15, may enable development of memory cell arrays in which the individual memory cells are not paired with select devices. Instead, the memory cells will have sufficient resistance to enable leakage to be sufficiently controlled without utilization of select devices. In other embodiments, the memory cells of the types described above with reference to FIGS. 5-15 may be incorporated into conventional memory array architectures utilizing conventional select devices.

The illustrated memory cells may be incorporated into integrated memory arrays. In such embodiments, one of the conductive structures 1 and 3 may along a first access/sense line, and the other of the conductive structures may be along a second access/sense line; and the memory cell may be uniquely addressed in the array through the combination of the first and second access/sense lines.

The memory cells and arrays discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In some embodiments, the invention includes a memory cell. The memory cell comprises a data storage region between a pair of conductive structures. The data storage region is configured to support a transitory structure which alters resistance through the memory cell. The data storage region comprises two or more portions, with one of the portions supporting a higher resistance segment of the transitory structure, and another of the portions supporting a lower resistance segment of the transitory structure.

In some embodiments, the invention includes a method of forming a memory cell. A data storage region is formed over a first conductive structure, and a second conductive structure is formed over the data storage region. The data storage region is configured to support a transitory structure which alters resistance through the memory cell. The data storage region comprises two or more portions which are physically different from one another so that one of the portions supports a higher resistance segment of the transitory structure, and another of the portions supports a lower resistance segment of the transitory structure. The physical difference is present prior to formation of the transitory structure.

In some embodiments, the invention includes a method of forming a memory cell. A first oxide region is deposited over a first conductive structure, a second oxide region is deposited over the first oxide region, and a second conductive structure is formed over the second oxide region. The first and second oxide regions are together comprised by a data storage region configured to support a transitory structure which alters resistance through the memory cell. The first oxide region is different from one the second oxide region so that one of the oxide regions supports a higher resistance segment of the transitory structure than the other of the oxide regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming a memory cell, comprising:
   forming a data storage region over a first conductive structure;
   forming a second conductive structure over the data storage region;
   wherein the data storage region is configured to support a transitory structure which alters resistance through the memory cell;
   wherein the data storage region comprises two or more portions which are physically different from one another so that one of the portions supports a higher resistance segment of said transitory structure and another of the portions supports a lower resistance segment of said transitory structure; the physical difference being present prior to formation of the transitory structure;

wherein the memory cell is formed to have multiple portions of the data storage region which support multiple lower resistance segments of said transitory structure; and wherein at least one of the lower resistance segments has a substantially different resistance than another of the lower resistance segments.

2. A method of forming a memory cell, comprising:

forming a data storage region over a first conductive structure;

forming a second conductive structure over the data storage region;

wherein the data storage region is configured to support a transitory structure which alters resistance through the memory cell;

wherein the data storage region comprises two or more portions which are physically different from one another so that one of the portions supports a higher resistance segment of said transitory structure and another of the portions supports a lower resistance segment of said transitory structure; the physical difference being present prior to formation of the transitory structure;

wherein the memory cell is formed to have multiple portions of the data storage region which support multiple higher resistance segments of said transitory structure; and wherein at least one of the higher resistance segments has a substantially different resistance than another of the higher resistance segments.

3. A method of forming a memory cell, comprising:

depositing a first oxide region over a first conductive structure;

depositing a second oxide region over the first oxide region;

forming a second conductive structure over the second oxide region; the first and second oxide regions together being comprised by a data storage region configured to support a transitory structure which alters resistance through the memory cell;

wherein the first oxide region is different from an-e the second oxide region so that one of the oxide regions supports a higher resistance segment of said transitory structure than the other of the oxide regions; and wherein the difference between the first and second oxide regions is a difference in crystallinity; and wherein said difference is imparted by:

depositing the first oxide region under first conditions utilizing a first temperature and a first pressure; and depositing the second oxide region under second conditions utilizing a second temperature and a second pressure; with the second temperate being different from the first temperature and/or with the second pressure being different from the first pressure.

4. The method of claim 3 wherein the transitory structure is a filament.

5. A method of forming a memory cell, comprising:

depositing a first oxide region over a first conductive structure;

depositing a second oxide region over the first oxide region;

forming a second conductive structure over the second oxide region; the first and second oxide regions together being comprised by a data storage region configured to support a transitory structure which alters resistance through the memory cell;

wherein the first oxide region is different from the second oxide region so that one of the oxide regions supports a higher resistance segment of said transitory structure than the other of the oxide regions; and wherein the difference between the first and second oxide regions is a difference in density; and wherein said difference is imparted by:

depositing the first oxide region under first conditions utilizing a first temperature and a first pressure; and depositing the second oxide region under second conditions utilizing a second temperature and a second pressure; with the second temperate being different from the first temperature and/or with the second pressure being different from the first pressure.

6. A method of forming a memory cell, comprising:

depositing a first oxide region over a first conductive structure;

depositing a second oxide region over the first oxide region;

forming a second conductive structure over the second oxide region; the first and second oxide regions together being comprised by a data storage region configured to support a transitory structure which alters resistance through the memory cell;

wherein the first oxide region is different from the second oxide region so that one of the oxide regions supports a higher resistance segment of said transitory structure than the other of the oxide regions;

wherein the difference between the first and second oxide regions is a difference in dopant concentration;

wherein the dopant is incorporated into one of the first and second oxide regions by in situ incorporation of the dopant into said one of the regions during the deposition of said one of the regions; and wherein the dopant comprises one or more elements, other than oxygen, selected from the group consisting of group 16 of the periodic table.

* * * * *

UNITED STATES PATENT AND TRADEMARK OFFICE
CERTIFICATE OF CORRECTION

PATENT NO.        : 8,785,288 B2
APPLICATION NO.   : 14/024836
DATED             : July 22, 2014
INVENTOR(S)       : Gurtej S. Sandhu et al.

It is certified that error appears in the above-identified patent and that said Letters Patent is hereby corrected as shown below:

In the Claims

In column 11, line 42, in Claim 3, delete "an-e the" and insert -- the --, therefor.

Signed and Sealed this
Thirteenth Day of January, 2015

Michelle K. Lee
*Deputy Director of the United States Patent and Trademark Office*